US009244823B2

(12) United States Patent  
Cho et al.

(10) Patent No.: US 9,244,823 B2  
(45) Date of Patent: Jan. 26, 2016

(54) SPECULATION TO SELECTIVELY ENABLE POWER IN A MEMORY

(71) Applicant: ORACLE INTERNATIONAL CORPORATION, Redwood Shores, CA (US)

(72) Inventors: Hoyeol Cho, Palo Alto, CA (US); Ioannis Orginos, Sunnyvale, CA (US); Jinho Kwack, San Ramon, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 166 days.

(21) Appl. No.: 13/673,011

(22) Filed: Nov. 9, 2012

(65) Prior Publication Data

US 2014/0136787 A1    May 15, 2014

(51) Int. Cl.
*G06F 12/08*    (2006.01)
*G06F 12/00*    (2006.01)

(52) U.S. Cl.
CPC ............... *G06F 12/00* (2013.01); *G06F 12/08* (2013.01)

(58) Field of Classification Search
None
See application file for complete search history.

(56) References Cited

U.S. PATENT DOCUMENTS

| 5,848,428 | A  * | 12/1998 | Collins | 711/127 |
| 7,330,934 | B2 * | 2/2008 | Schubert | 711/128 |
| 2009/0049245 | A1 * | 2/2009 | Resnick | 711/118 |
| 2014/0052917 | A1 * | 2/2014 | Koka et al. | 711/120 |

OTHER PUBLICATIONS

NPL_intel_Pentium_Processor_1997 (2 pages).*

* cited by examiner

*Primary Examiner* — Aimee Li
*Assistant Examiner* — Tracy Chan
(74) *Attorney, Agent, or Firm* — Kraguljac Law Group LLC

(57) ABSTRACT

Systems, methods, and other embodiments associated with speculating whether a read request will cause an access to a memory are described. In one embodiment, a method includes detecting, in a memory, a read request from a processor and speculating whether the read request will cause an access to a memory bank in the memory based, at least in part, on an address identified by the read request. The method selectively enables power to the memory bank in the memory based, at least in part, on speculating whether the read request will cause an access to the memory bank.

20 Claims, 5 Drawing Sheets

SPECULATION TO SELECTIVELY ENABLE POWER IN A MEMORY

BACKGROUND

Indicators of a memory's performance can include the amount of power consumed by the memory and the speed at which a processor can access data in the memory. Typically, a first level cache memory has the lowest possible latency as compared to other levels of memory. In general, lower latency means that less time is used to provide access to data stored in the memory. This in turn helps to improve performance of a processor. Higher level cache memory (e.g., Level 3—L3) may have higher access latencies due to their design configuration relative to the processor. As such, the processor will access the higher level cache less frequency. However, when accessing higher level cache, there is a greater possibility of a read request having no corresponding entry in the memory (i.e., a miss). When there is no entry in the memory, the memory is still activated (e.g., powered) because qualifying the miss takes an extra clock cycle from when the read request is detected and the memory is enabled.

Thus, the memory dissipates power even though a read operation is not performed in the memory. When the memory is part of a mobile device such as a cellular phone or tablet computer, the power dissipation limits battery life, which is undesirable.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements or that multiple elements may be designed as one element. In some embodiments, an element shown as an internal component of another element may be implemented as an external component and vice versa. Furthermore, elements may not be drawn to scale.

DETAILED DESCRIPTION

Figure 1:
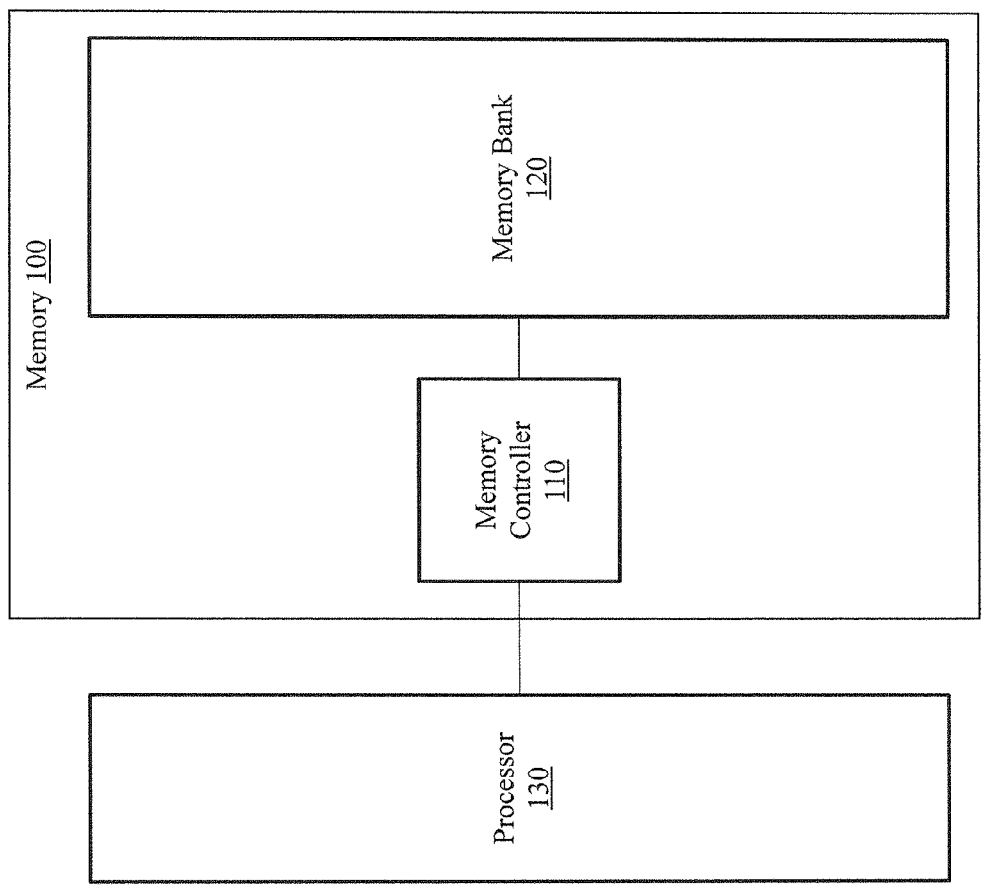
FIG. 1 illustrates one embodiment of a memory associated with speculating whether a read request will cause an access to the memory.

Described herein are systems, method, and other embodiments associated with power activation control for a memory array. In one embodiment, a memory system is configured to speculate whether a read request will cause an access to the memory array. In one embodiment, the memory system is configured to prevent enabling power to the memory array by speculating whether a read request will cause an access to the memory. In this manner, the memory prevents dissipating power when no read operation will actually occur.

For example, consider a processor with an embedded cache memory. The cache memory stores data for quicker access by the processor than if the processor were to access the same data from a main memory. The cache memory can include several layers of memory. A first layer of cache memory stores data that the processor most frequently accesses while higher layers of cache memory (e.g., level 3 or L3) store data that the processor accesses less frequently.

The cache memory may also be set associative. Set associative cache memory is a memory that maps a memory address, for example, a processor address that refers to a specific location in main memory to more than one possible location in the cache memory. In this technique, the cache memory reduces a possibility of a miss from multiple addresses mapping to a same location in the cache and overwriting data. However, when using a set-associative cache memory, a "way" is determined to locate data in the cache memory. A "way" refers to a location out of several possible locations where data is stored. In general, a way for a read request is determined quickly from a lookup table or index. Thus, the processor knows quickly in which way of the cache memory that data for a request may be stored.

However, to insure the data in a way is valid, a second determination is made prior to the data actually being read from the memory. The second determination qualifies whether the location where the data is stored has been accessed by a different process, or for example, a different processing core of the processor. With this technique, the memory insures that data read from the memory is valid and has not been overwritten or otherwise changed by a different processing core.

Further consider that when the memory receives the read request there is a chance that the memory will find no way in which data exists for the request. When a read request results in a no hit in any of the possible ways, a "read no way hit" occurs. The read no way hit is a cache miss because there is no data in the cache corresponding to the request. As a result, the processor then tries to retrieve the data from the next level of memory, for example, a higher level of cache memory or a main memory.

Activating the memory bank occurs prior to the second determination, which qualifies the read request and ends the read request if it is a read no way hit. Because determining a way for a read request is quick but qualifying whether data in a way is valid is slower, a read no way hit in prior designs resulted in the memory enabling power to a memory bank without actually accessing the memory bank. Accordingly, the memory wastes power by enabling the memory bank prior to qualifying the read request. Thus, in one embodiment, the memory disclosed herein is configured to speculate whether the read request will cause a read no way hit or a way hit (e.g., whether the read request will cause an access to the memory). By performing the speculation, the memory can decide how to control power and can prevent powering of the memory when no access will occur to thereby save power.

With reference to FIG. 1, one embodiment of a memory 100 associated with speculating whether a read request will cause an access is illustrated. In one embodiment, the memory 100 includes a memory controller 110 and a memory bank 120. The memory 100 may be a cache memory or other memory that stores data for a processor (e.g., processor 130). A cache memory is a type of memory that is typically integrated with the processor 130. The processor 130 uses cache memory to reduce access time to data by storing a copy of data that is frequently used in the cache memory instead of accessing the actual data in a main memory, which has slower access times.

In one embodiment, the memory 100 is configured as a set associative memory. A set associative memory is a cache memory that may store data into one of multiple possible locations to account for multiple addresses indexing to a same location in a memory bank 120. Because a cache memory is smaller than a main memory for which the cache is storing a copy of data, multiple addresses for the main memory may map to a same location in the memory bank 120. To account for collisions between data mapping to the same location, the cache memory can store data for an address in one of multiple locations to prevent replacing stored data when a collision occurs.

Accordingly, the memory 100 includes the memory controller 110 that is configured to control access to the memory bank 120 by the processor 130. The memory controller 110 is configured to determine in which way of the memory bank 120 that data is stored. As previously stated, a "way" refers to a possible location in the memory bank 120 of two or more possible locations where data associated with a main memory address may be stored. Accordingly, if data from a main memory address is cached in the memory bank 120 then it is located in one way of multiple possible ways. The memory bank 120 is configured to store data. The memory bank 120, while illustrated as a single contiguous bank, may include a plurality of separately addressable memory banks.

Consider an example read request from the processor 130 to the memory 100. The processor 130 requests data identified in the read request by an address. The address is, for example, a processor address that identifies a location in main memory (not illustrated). Accordingly, the memory controller 110 determines in which way of the memory bank 120 data for the read request is stored after the read request is received. After determining the way in which the data is stored, the memory controller 110 qualifies whether the way has been written to by, for example, a different processing core than the core that made the read request, as identified by the read request.

However, the memory bank 120 is typically powered prior to qualifying whether another core or process has written to the way because the qualifying takes, for example, an extra clock cycle. Consequently, the memory controller 110 is configured to speculate whether the read request will result in an access to the memory bank 120 and to prevent enabling power to the memory bank 120 when the speculating determines that the memory bank 120 will not be accessed.

In one embodiment, the memory controller 110 is configured to speculate whether the read request will result in an access to the memory bank 120 by checking whether the read request resulted in a way hit. For example, the memory controller 110 is configured to prevent enabling power to the memory bank 120 when the read request results in a read no way hit. That is, when there is no way of the possible ways that store data for the read request, the speculating result causes the memory controller 110 to disable power to the memory bank 120 (e.g., prevent power from being supplied to the memory bank). In other words, the memory controller 110 prevents powering of the memory bank 120 when no actual read will occur. In one embodiment, the memory controller 110 includes circuitry configured to control power that is supplied to the memory bank 120 (e.g., to enable and disable the power). Thus, the memory controller 110 saves power by preventing power dissipation when no read operation will occur in the memory bank 120 for a read request.

Figure 2:
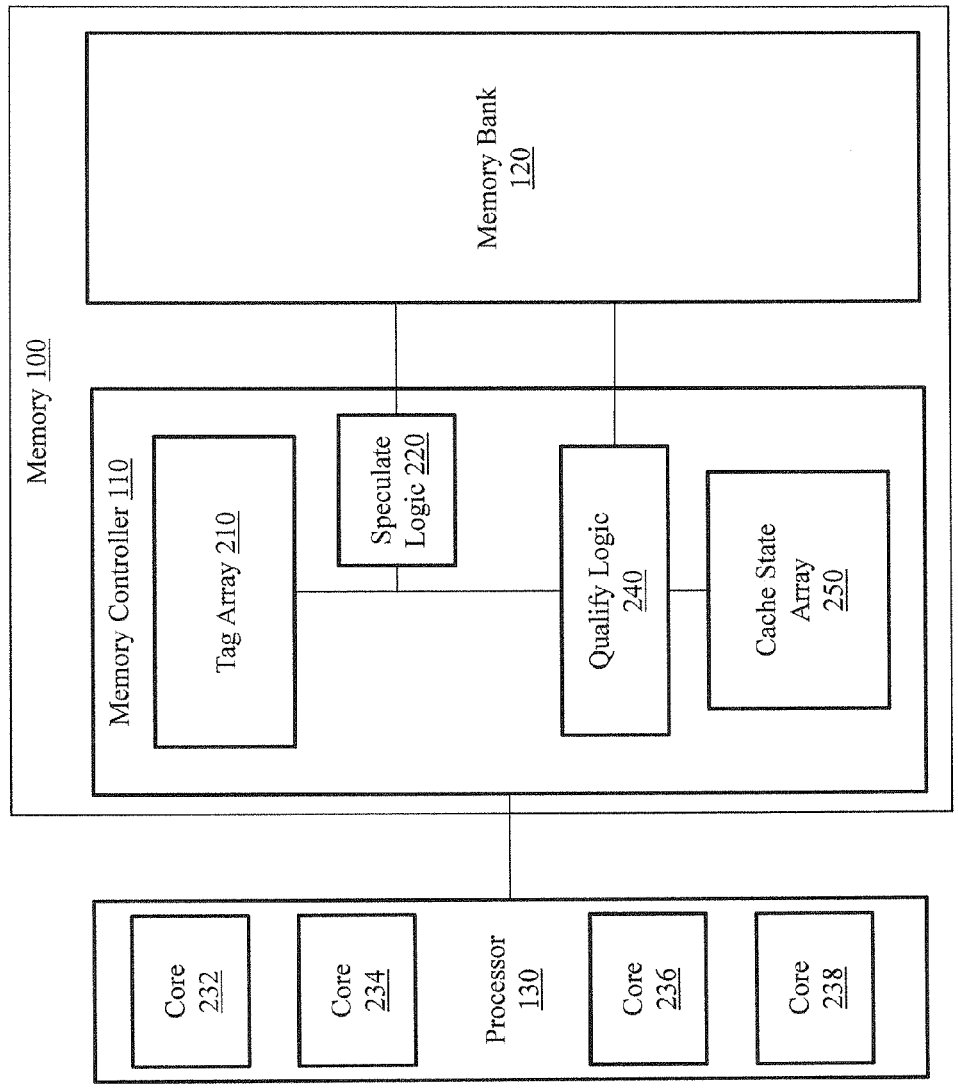
FIG. 2 illustrates another embodiment of a memory associated with speculating whether a read request will cause an access to the memory.

Consider FIG. 2, which illustrates another embodiment of the memory 100 of FIG. 1. In FIG. 2, the memory controller 110 includes a tag array 210, speculate logic 220, qualify logic 240, and a cache state array 250. The processor 130 is illustrated with multiple processing cores (e.g., four processing cores 232, 234, 236, and 238). Each of the processing cores 232, 234, 236, and 238 in the processor 130 can make separate read and/or write requests to the memory 100.

For example, when the processing core 232 sends a read request to the memory 100, the tag array 210 determines in which way of the possible ways of the memory bank 120 that data may be stored. The read request includes an address of the data in a main memory. The address identifies the data and is used by the tag array 210 to determine a way. The tag array 210 includes an index of ways that have entries indicating whether data is stored in the memory bank 120. Thus, when the tag array 210 receives the read request, the index is checked to determine whether there is an entry for the address specified in the read request. For example, if the memory 100 is a 2-way set associative cache memory, the tag array 210 is configured with two separate index locations that may specify whether data is stored in the memory bank 120 for the read request.

Accordingly, the tag array 210 is configured to check a first index location and if there is no entry in the first index, then the tag array 210 provides a signal specifying a "read no way hit." There is no need to check a second index location if the first index location is empty. This means that there is no entry in the memory bank 120 for the read request and the memory bank will not be accessed. Instead, the read request will need to be serviced from main memory. However, even though no entry exists in the memory bank 120 for the read request, typically, the memory bank 120 is still powered as though a read will occur.

The memory bank 120 is typically still powered because the qualify logic 240 is configured to qualify the determination from the tag array 210 prior to finalizing whether a read will occur for the read request. In one example, a read no way hit occurs for approximately 10% of requests to the memory 100. Consider Table 1.

TABLE 1

| Request Type | Percent of Occurrence |
| --- | --- |
| Read (Valid) | 24% |
| Read (No Way) | 10% |
| Write | 8% |
| NOP | 58% |

Table 1 illustrates that, in general for this example, ten percent of all requests to the memory are read requests that result in no way hits, or nearly thirty percent of read requests. Accordingly, significant power savings can be realized by controlling the power supplied to the memory banks based on the condition of the read request, which in one embodiment includes preventing powering of the memory bank 120 when a read no way hit occurs.

Thus, in one embodiment, the speculate logic 220 is configured to speculate whether a read request from the processor 130 will cause an access to the memory bank 120. For example, the speculate logic 220 determines whether the read request is a read no way hit and will prevent the memory bank 120 from receiving power when a read no way hit occurs. Accordingly, the speculate logic 220 speculates whether the read request will cause an access to the memory bank 120 based, at least in part, on the index of entries from the tag array 210.

As an example, consider that the request from the processing core 232 is received in the memory 100 and is initially processed by the tag array 210. The tag array 210 determines that the read request has no entry in the index. Consequently, the tag array 210 generates a signal that indicates a read no way hit. The signal is provided by the tag array 210 to the speculate logic 220 and the qualify logic 240. When the signal from the tag array 210 indicates a read no way hit, the speculate logic 220 disables power to the memory bank 120 so that power is not dissipated when a read operation is not going to occur. Alternatively, when the signal indicates a read way hit, then the speculate logic 220 enables power to the memory bank 120.

In either case, the qualify logic 240 also receives the signal from the tag array 210. The qualify logic 240 is configured to determine whether an entry in the memory bank 120 for the read request is valid by checking a valid bit in a cache state array 250. The qualify logic 240 performs this check even when a result from the tag array 210 indicates a read no way hit. Consequently, a delay in time from the operations of the qualify logic 240 is what caused the memory bank 120 to be powered during a read no way hit in some prior designs. The speculate logic 220 is implemented to prevent the power dissipation in at least this situation.

In one embodiment, the speculate logic 220 is configured to prevent powering the memory bank 120 by, for example, preventing power that activates memory cells in the memory bank 120, preventing power to a sense amplifier in the memory bank 120, preventing power to a word line driver in the memory bank 120, preventing power to a clock generator in the memory bank 120, and so on. In general, when a read no way hit occurs, the speculate logic 220 prevents the memory bank 120 from consuming power as it would if a read operation was to occur by turning off the power supply to the memory bank 120.

To continue with the example of processing a request to read data from a location, the cache state array 250 is configured with a table or index of entries. The table includes, for example, entries that indicate which of the processing cores 232, 234, 236, and 238 last wrote to each location (e.g., way) in the memory bank 120. The cache state array 250 uses the table entries to compare the processing core that sent the read request (e.g., core 232) to the processing core that last wrote to the location specified in the read request. If the table indicates a different processing core (e.g., core 238) last wrote to the location in the memory bank 120, then the location in the memory bank 120 is considered dirty or invalid.

Thus, prior to the qualify logic 240 determining whether a possible entry for the read request in the memory bank 120 is valid, the speculate logic 220 has already enabled or disabled power to the memory bank 120. By by-passing the qualify logic 240, the speculate logic 220 determines whether the memory bank 120 will be accessed sooner than is determined by the qualify logic 240 and, therefore, the speculate logic 220 saves power from being dissipated when no read operation will occur.

Figure 3:
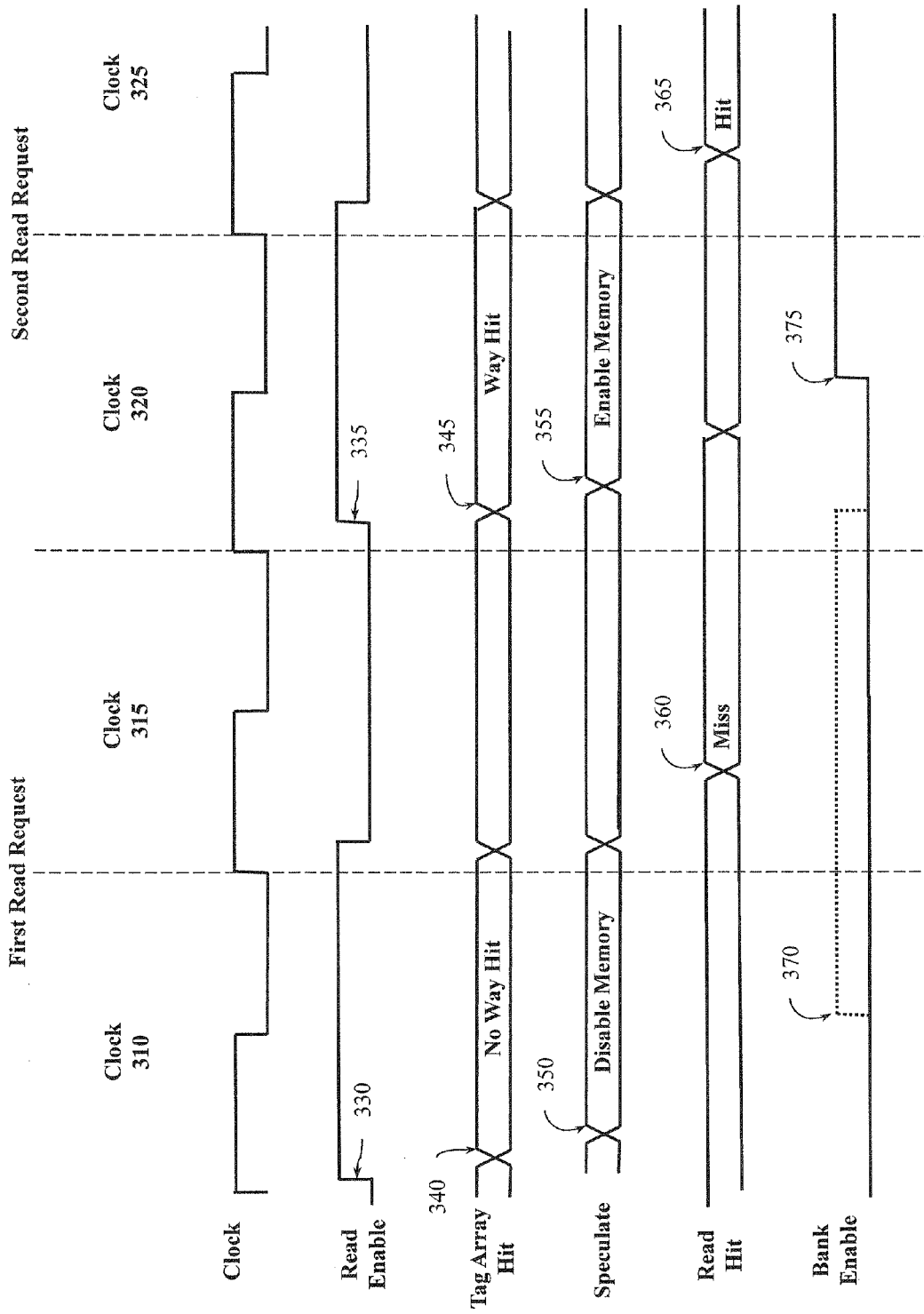
FIG. 3 illustrates one embodiment of a timing diagram associated with a memory.
Figure 4:
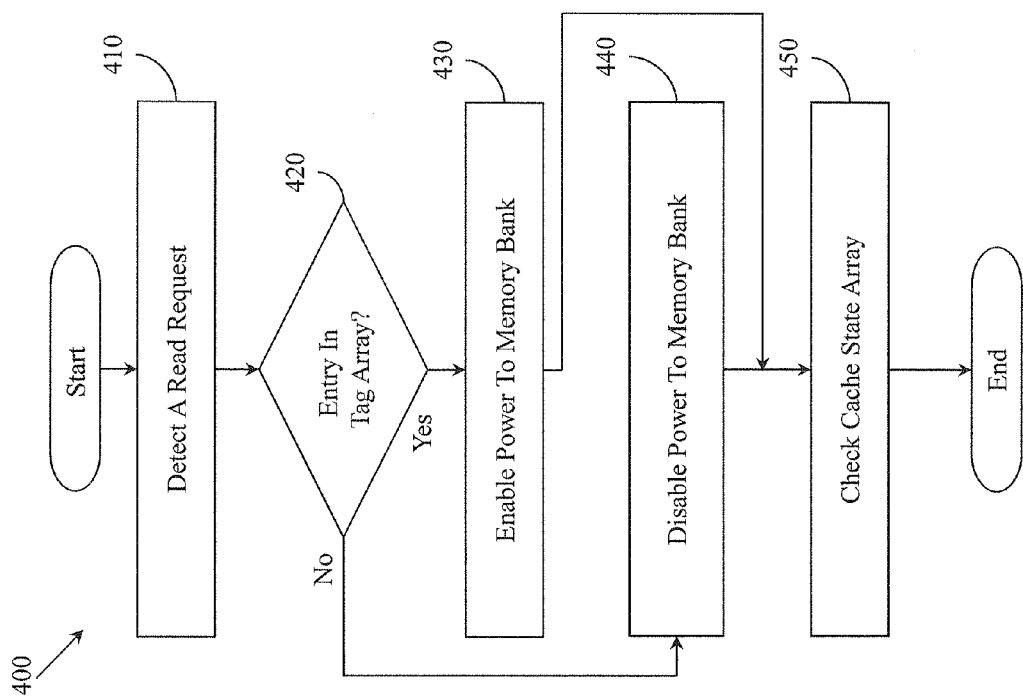
FIG. 4 illustrates an embodiment of a method associated with speculating whether a read request will cause an access to a memory.

With reference to FIG. 3, one example of a timing diagram is shown associated with processing read requests based on the memory described above. FIG. 3 will be discussed in combination with FIG. 4, which illustrates one embodiment of a method associated with speculating whether a read request will cause an access to memory. FIG. 4 will be discussed from the perspective of the memory 100 FIG. 1.

FIG. 3 illustrates four clock cycles (310, 315, 320, and 325). Clock cycles 310 and 315 illustrate operations associated with a first read request and clock cycles 320 and 325 illustrate operations associated with a second read request.

The read requests illustrated in FIG. 3 are two-cycle throughput operations. That is, for every two cycles of the clock one read or write can be performed. However, in other embodiments, read requests and write requests may use fewer clock cycles per operation (e.g., one) or more clock cycles per operation (e.g., three, four, and so on). For the sake of comparison, the first read request results in a read no way hit and the second read request results in a read way hit. FIG. 3 will now be discussed with relation to the flow chart of FIG. 4.

At 410 of method 400, the memory controller 110 detects/receives read requests from a requester (e.g., the processor 130). The read requests are, for example, requests to read data from the memory 100. In FIG. 3, the first read request is received at clock 310 and the second read request is received at clock 320. As a result of detecting/receiving the read requests, a read enable signal is generated at 330 and 335 respectively. In one embodiment, the read enable signal in combination with a speculate signal control whether the memory bank 120 will be powered.

At 420, the memory controller 110 checks whether there is an entry in a tag array for a memory address identified by the read request. The memory controller 110 uses a result from checking the tag array to speculate whether the read request will cause an access to the memory bank 120. For example and with reference to FIG. 3, suppose the check results in a determination of a no way hit at label 340 for the first read request and a way hit at label 345 for the second read request.

Accordingly, for the first read request of FIG. 3, the memory controller 110 determines that there is no hit in the tag array. Because there is no hit or entry in the tag array for the read request, the method proceeds to 440 and power to the memory bank is disabled. This operation correlates with a speculate signal generated at label 350, which disables power to the memory bank 120. A delay between initially receiving the read request at 330 and a determination by the memory controller 110 to disable the memory at 350 is relatively small. In this manner, the memory controller 110 can prevent powering of the memory bank 120 when a read no way hit occurs.

For the second read request of FIG. 3, the memory controller 110 determines that there is a hit in the tag array (at decision block 420 of FIG. 4). Because there is a hit or entry in the tag array for the read request, the method proceeds to 430 and power is enabled to the memory bank. This operation correlates with a speculate signal generated at label 355 to enable power to the memory bank 120.

After either enabling or disabling power to the memory bank at 430 or 440 respectively, the method proceeds to 450 where a cache state array is checked for the read request. The cache state array qualifies the read request by determining a state of the entry (or if the entry exists) in the memory bank 120 for the memory address identified in the read request. In one embodiment, determining the state of the entry includes checking whether the entry in the memory bank 120 has been accessed by a source different from a source identified in the read request that sent the request.

The operation at 450 of method 400 correlates with a miss at label 360 in FIG. 3 for the first read request and a hit at 365 for the second read request. FIG. 3 illustrates how a qualification at 360, which corresponds to the no way hit at 340, is a full clock cycle later. The miss 360 further illustrates how qualification of the read no way hit occurs after the memory bank 120 would be typically enabled, which occurs at label 370. The dashed signal represented by 370 illustrates how the memory bank would be powered if the speculate signal 350 did not prevent power to the memory bank 120. Additionally, a bank enable signal at 375 illustrates how the enable power signal 355 permits powering of the memory bank 120 when the speculation results in a determination that the memory bank will be accessed.

Figure 5:
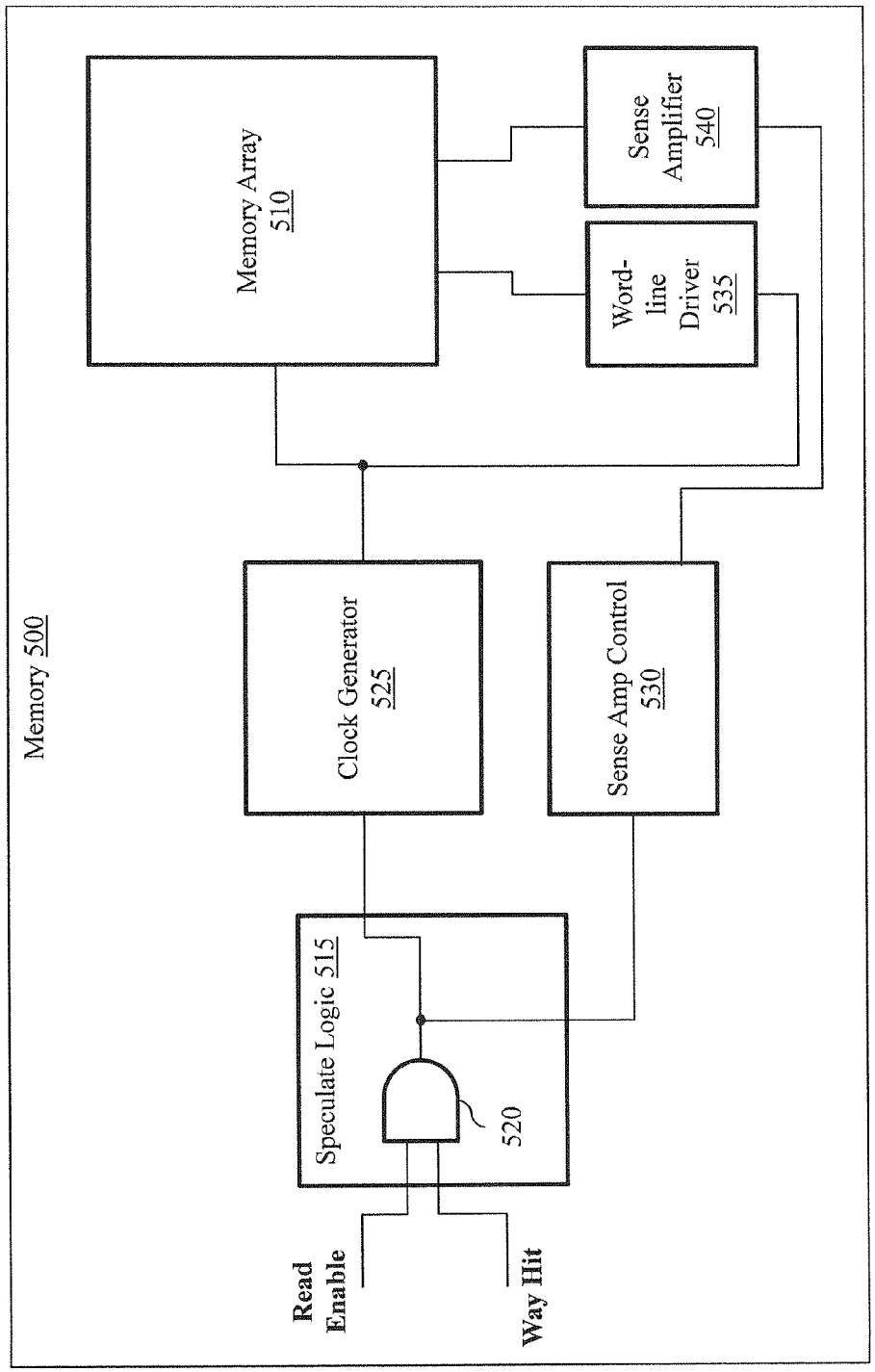
FIG. 5 illustrates another embodiment of a memory associated with speculating whether a read request will cause an access to the memory.

Now, consider FIG. 5, which illustrates another embodiment of a memory 500 configured to speculate on read requests and control power to a memory array 510 based on the speculation. The memory 500 includes the memory array 510, speculate logic 515, an AND gate 520, a clock generator 525, a sense amp control 530, a word-line driver 535, and a sense amplifier 540. Of course, the memory 500 can include more elements than those illustrated in FIG. 5. For example, the memory 500 can include a row decoder control logic, a column decoder control logic, and so on. Additionally, those elements that are not illustrated may also include connections with elements that are shown (e.g., connections between the column decoder control logic and the sense amplifier 540, and so on). In one embodiment, the memory 100 is a cache memory that is integrated on a semiconductor chip with a microprocessor. For example, the memory 500 can be a first, second, or third level cache memory that stores data from a main memory for quicker access by the microprocessor.

Additionally, the memory 500 may include separate read column select and write column select inputs. In one embodiment, a read latency of the memory 500 is improved by separating the read column select from the write column select. Column select is a signal that indicates in which column of the memory array 510 an operation is to be performed (e.g., read or write). Accordingly, in one embodiment, the column select input is separate for read operations and write operations. That is, there is a separate pathway for a read column select signal from a write column select signal. In this way, latency of read operations in the memory 500 can be improved. In one embodiment, each column in the memory array 510 is a different "way" where data may be stored.

Continuing with FIG. 5, data is arranged in the memory array 510 in, for example, a column and row format. The clock generator 525 generates a clock signal for controlling the memory array 510. The word line driver 535 and the sense amplifier 540 are configured to read data from the memory array 510 as controlled by the sense amp control 530. The word-line driver 535 and the sense amplifier both apply power to the memory array 510 to read values. The speculate logic 515 is configured to determine whether a read request will cause an access to the memory array 510 to read out data. In one embodiment, if the speculate logic 515 determines that a read request will not cause data to be read from the memory array 510, then the speculate logic 515 prevents the memory array 510 from receiving power.

For example, the AND gate 520 of speculate logic 515 receives two signals as input, a read enable signal and a way hit signal. Accordingly, the speculate logic 515 speculates whether the read request will cause an access to the memory array 510 as a function of the read enable signal and the way hit signal. The read enable signal is, for example, a signal from the microprocessor that indicates a read request/operation is desired to read data from an address in main memory. However, the memory 500 intercepts the request because it is a cache memory that may store the same data sought from main memory but can provide the data more quickly. The way hit signal is a signal from a tag array that indicates which way, if any, data for the request is stored in. The tag array may be part of the memory 500 or may, for example, be a separate integrated circuit.

Consequently, when both the read enable signal and the way hit signal are high (e.g., "1"), the speculate logic 515 enables power to the clock generator 525, to the sense amp control 530, to the word-line driver 535, and to the sense amplifier 540 via the AND gate 520. Conversely, the speculate logic 515 uses the AND gate 520 to prevent powering these components when, for example, the way hit signal is low and thus the memory array 510 will not be accessed. Similarly, if the read enable signal is low, then no read operation is occurring and thus the array also does not need to be powered. Accordingly, using the read enable signal and the way hit signal from the tag array, the memory 500 can improve power dissipation by not powering the memory array 510 and related components (e.g., 525, 530, 535, and 540) when no read operation will occur.

In another embodiment, the described methods and/or their equivalents may be implemented with computer executable instructions. Thus, in one embodiment, a non-transitory computer-readable medium is configured with stored computer executable instructions that when executed by a machine (e.g., processor, computer, and so on) cause the machine (and/or associated components) to perform the method 400.

While for purposes of simplicity of explanation, the illustrated methodologies in the figures are shown and described as a series of blocks, it is to be appreciated that the methodologies are not limited by the order of the blocks, as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional blocks that are not illustrated.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a non-transitory medium that stores instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes computer or electrical hardware, firmware, a non-transitory computer readable medium that stores instructions, and/or combinations of each to perform a function(s) or an action(s), and/or to cause a function or action from another logic, method, and/or system. Logic may include a microprocessor controlled by an algorithm, a discrete logic (e.g., ASIC), an analog circuit, a digital circuit, a programmed logic device, a memory device containing instructions, and so on. Logic may include one or more gates, combinations of gates, or other circuit components. Where multiple logics are described, it may be possible to incorporate the multiple logics into one physical logic. Similarly, where a single logic is described, it may be possible to distribute that single logic between multiple physical logics.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is used in the detailed description or claims (e.g., A or B) it is intended to mean "A or B or both". When the applicants intend to indicate "only A or B but not both" then the phrase "only A or B but not both" will be used. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is used herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be used.

The invention claimed is:

1. A method, comprising:
   detecting, in a memory, a read request from a processor;
   speculating whether the read request will cause an access to a memory bank in the memory based, at least in part, on an address identified by the read request; and
   selectively enabling power to the memory bank in the memory based, at least in part, on the speculating, wherein selectively enabling power to the memory bank includes:
      preventing powering of a word line driver and a sense amplifier when the speculating determines the read request is a read-no-way hit, and
      enabling power to the memory bank when speculating determines the read request is a hit that has not been qualified; and
   checking a cache state array to determine a state of an entry in the memory bank for the address identified by the read request, wherein checking the cache state array qualifies the hit by identifying whether the entry is valid and occurs after checking a tag array to determine whether an entry exists in the memory bank for the read request and after selectively enabling power to the memory bank.

2. The method of claim 1, wherein selectively enabling power to the memory bank includes preventing the memory from powering the memory bank when an entry does not exist in the tag array by generating a signal that prevents power from being provided to the memory bank, and permitting the memory to power the memory bank prior to qualifying the entry when the entry does exist.

3. The method of claim 1, wherein selectively enabling power to the memory bank includes preventing powering of a sense amplifier, one or more memory cells in the memory bank and a clock generator associated with the read request when the speculating determines no access to the memory bank will occur.

4. The method of claim 1, wherein selectively enabling power to the memory bank includes controlling whether the memory bank is powered prior to qualifying the read request with the cache state array to prevent powering of the memory bank when the read request is a read-no-way hit.

5. The method of claim 1, wherein checking the cache state array includes checking whether the entry in the memory has been accessed by a source different from a source identified by the read request.

6. The method of claim 1, wherein the read request is from a processing core of multiple processing cores in the processor.

7. The method of claim 1, wherein speculating whether the read request will cause an access to a memory bank in the memory includes using the tag array of the memory to determine in which way of a number of set-associative ways in the memory an entry exists for the read request, and wherein the memory is a cache memory of the processor.

8. A memory controller for controlling access to a memory bank, comprising:
   a tag array configured to store an index of entries and to determine, using the index of entries, in which way of the memory bank that data associated with an address in a read request is stored;
   speculate logic configured to speculate whether the read request will cause an access to the memory bank based, at least in part, on the index of entries, and to:
      disable power to the memory bank when the speculating determines the read request is a read-no-way hit by preventing powering of a word line driver and a sense amplifier associated with the read request, and
      enable power to the memory bank when the read request matches an entry in the tag array prior to qualifying the entry; and
   qualify logic configured to check a cache state array for the read request to determine a state of an entry in the memory bank associated with the read request, wherein the qualify logic is configured to determine whether the entry is valid after the speculate logic selectively disables power to the memory bank and after the tag array determines whether an entry exists in the memory bank for the read request.

9. The memory controller of claim 8, wherein the speculate logic is configured to control whether the memory bank is powered prior to qualifying the read request with the cache state array to prevent powering of the memory bank while checking the cache state array when the speculate logic determines the read request is a read-no-way hit.

10. The memory controller of claim 8, wherein the speculate logic is configured to speculate whether the read request will cause an access to the memory bank by checking whether the index includes an entry for the address identified by the read request without qualifying the read request with the cache state array, and
   wherein the speculate logic is configured to disable power to the memory bank when the index does not include an entry for the address identified by the read request and to enable power to the memory bank when the index does include an entry for the address identified in the read request.

11. The memory controller of claim 8, wherein the speculate logic is configured to enable or disable power to the memory bank prior to a signal from the cache state array being generated that indicates whether an entry for the address identified in the read request is valid.

12. The memory controller of claim 8, wherein the tag array is a tag array for indexing different set associative ways for storing entries in the memory bank, wherein the speculate logic is configured to disable power to the memory bank when the speculation determines that the tag array indicates the read request is a read-no-way hit by preventing powering of the sense amplifier, one or more memory cells in the memory bank and a clock generator associated with the read request.

13. The memory controller of claim 8, wherein the read request is from a processing core of multiple processing cores in a processor associated with the memory.

14. The memory controller of claim 8, wherein the speculate logic is configured to speculate whether the read request will cause an access to the memory bank as a function of two or more control signals that include a read enable signal and a way hit signal.

15. The memory controller of claim 8, wherein the memory includes separate read and write column select controls.

16. The memory controller of claim 8, wherein the memory is a level three cache memory.

17. An apparatus, comprising:
- a tag array configured to determine in which way of a memory data associated with an address in a read request is stored, wherein the tag array is configured to receive read requests from at least a processor core;
- a speculate logic configured to speculate whether the read request will cause an access to a way of the memory as a function of two or more control signals, wherein the control signals include a way signal from the tag array and a read enable signal from the processor core that sent the read request,
- wherein the speculate logic is configured to disable power to a sense amplifier and a word line driver when the read request is a read-no-way-hit; and
- qualify logic configured to check a cache state array for the read request to determine a state of an entry in the memory identified by the read request, wherein the qualify logic is configured to check the cache state array after the speculate logic selectively disables power to the memory bank and after the speculate logic determines whether an entry exists in the memory bank for the read request.

18. The apparatus of claim 17, wherein the speculate logic is configured to enable power to the memory when the read enable signal is active and the way signal indicates a way of the memory stores the data, wherein the speculate logic is configured to disable power to a sense amplifier, one or more memory cells in the memory bank and a clock generator when the memory will not be accessed for the read requests.

19. The apparatus of claim 17, wherein the speculate logic is configured to control whether the memory bank is powered prior to qualifying the read request to prevent powering of the memory while checking the cache state array when the speculate logic determines the read request is a read-no-way hit.

20. The apparatus of claim 17, wherein the speculate logic is configured to prevent power to the memory when the way signal indicates no way of the memory stores the data.

* * * * *